(12) United States Patent
Matsuyama et al.

(10) Patent No.: US 10,261,131 B2
(45) Date of Patent: Apr. 16, 2019

(54) INSPECTION METHOD FOR SECONDARY BATTERY

(71) Applicant: TOYOTA JIDOSHA KABUSHIKI KAISHA, Toyota-shi, Aichi-ken (JP)

(72) Inventors: Yoshio Matsuyama, Nisshin (JP); Tomohide Sumi, Nagoya (JP); Yosuke Shimura, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 500 days.

(21) Appl. No.: 15/075,357

(22) Filed: Mar. 21, 2016

(65) Prior Publication Data
US 2016/0291093 A1 Oct. 6, 2016

(30) Foreign Application Priority Data

Mar. 31, 2015 (JP) ................................ 2015-070843

(51) Int. Cl.
*G01R 31/36* (2006.01)
(52) U.S. Cl.
CPC ................................ *G01R 31/3627* (2013.01)
(58) Field of Classification Search
CPC .............................................. G01R 31/3627
See application file for complete search history.

(56) References Cited

U.S. PATENT DOCUMENTS

2016/0377667 A1* 12/2016 Friedrich ........... G01R 31/3624
324/434
2017/0030975 A1* 2/2017 Ueno ..................... G01R 31/36

FOREIGN PATENT DOCUMENTS

| JP | 2009-004389 A | 1/2009 |
| JP | 2012-138192 A | 7/2012 |
| JP | 2016-029616 A | 3/2016 |

* cited by examiner

*Primary Examiner* — Daniel R Miller
(74) *Attorney, Agent, or Firm* — Sughrue Mion, PLLC

(57) ABSTRACT

An inspection method for a secondary battery according to the invention includes: a first aging treatment process for performing aging treatment on the secondary battery that has initially been charged at a first temperature; a first voltage measurement process; a second aging treatment process for performing the aging treatment on the secondary battery at a second temperature; a second voltage measurement process; a self-discharge amount computation process; a non-temperature dependent failure determination process for determining non-temperature dependent failure that does not depend on a relationship between a self-discharge amount and a temperature in accordance with the measured self-discharge amount; and a temperature dependent failure determination process for determining temperature dependent failure that depends on the relationship between the self-discharge amount and the temperature in accordance with the self-discharge amount, temperature dependency of which is suppressed.

9 Claims, 12 Drawing Sheets

| TEMPERATURE | 20°C | 30°C | 40°C | 50°C | 60°C |
|---|---|---|---|---|---|
| PERMISSIBLE TIME | 48h | 9h | 5h | 2h | 0.6h |

INSPECTION METHOD FOR SECONDARY BATTERY

INCORPORATION BY REFERENCE

The disclosure of Japanese Patent Application No. 2015-070843 filed on Mar. 31, 2015 including the specification, drawings and abstract is incorporated herein by reference in its entirety.

BACKGROUND OF THE INVENTION

1. Field of the Invention

The invention relates to an inspection method for a secondary battery and, in particular, to an inspection method for a secondary battery in which quality is determined by performing aging treatment.

2. Description of Related Art

As a related secondary battery, a secondary battery that includes an electrode body in which a positive electrode and a negative electrode are stacked via a separator has been known. In the case where a foreign material such as a metal is mixed in a portion between the positive electrode and the negative electrode during manufacturing of such a secondary battery, the positive electrode and the negative electrode are possibly short-circuited, which possibly causes short-circuit failure by which a battery voltage is significantly lowered.

As an inspection method for the related secondary battery that detects such short-circuit failure, a method described in Japanese Patent Application Publication No. 2009-004389 (JP 2009-004389 A) has been known, for example. It is described in JP 2009-004389 that, in the inspection method for the secondary battery that includes a process of performing first aging treatment under a high-temperature environment and a process of performing second aging treatment under a lower-temperature environment than the first aging treatment, a terminal voltage V1 of the secondary battery before performance of the second aging treatment is measured, a terminal voltage V2 of the secondary battery after the performance of the second aging treatment is measured, and failure caused by a short circuit of the secondary battery is determined from a voltage difference ΔV between the terminal voltage V1 and the terminal voltage V2.

SUMMARY OF THE INVENTION

In the related inspection method like that in JP 2009-004389 A, the second aging treatment is performed for two days to two weeks. Thus, the secondary battery before the performance of the second aging treatment and the secondary battery after the performance of the second aging treatment differ from each other in temperature. In general, the secondary battery has such a characteristic that a self-discharge amount is increased when the temperature is increased. Thus, when the temperatures at two voltage values used for a quality determination differ from each other, inspection accuracy is possibly degraded.

In view of the above, the invention provides an inspection method for a secondary battery that can improve inspection accuracy.

In an aspect of the invention, an inspection method for a secondary battery includes: a first aging treatment process; a second aging treatment process; a process for measuring a first voltage; a process for measuring a second voltage; a computation process for computing a voltage difference between the first voltage and the second voltage; a first determination process for determining first failure in accordance with a self-discharge amount; and a second determination process for determining second failure in accordance with the self-discharge amount, temperature dependency of which is suppressed. In the first aging treatment process, aging treatment is performed on the secondary battery that has initially been charged under a first temperature. In the second aging treatment process, the aging treatment is performed on the secondary battery under a second temperature. The second temperature is a lower temperature than the first temperature. The first voltage in the process for measuring the first voltage is a voltage of the secondary battery that is measured under the first temperature after termination of the first aging treatment process. The second voltage in the process for measuring the second voltage is a voltage of the secondary battery that is measured after termination of the second aging treatment process. The voltage difference in the computation process for computing the voltage difference between the first voltage and the second voltage is computed as the self-discharge amount of the secondary battery in the second aging treatment process. The first failure in the first determination process for determining the first failure in accordance with the self-discharge amount does not depend on a relationship between the self-discharge amount and a difference between a temperature during measurement of the first voltage and a temperature during measurement of the second voltage. The second failure in the second determination process for determining the second failure in accordance with the self-discharge amount, the temperature dependency of which is suppressed, depends on the relationship between the self-discharge amount and the difference between the temperature during the measurement of the first voltage and the temperature during the measurement of the second voltage.

In the above aspect, the aging treatment may be performed on the plural secondary batteries in the first aging treatment process and the second aging treatment process. Failure may be determined in the first determination process when a variation in the voltage difference between the first voltage and the second voltage in the plural secondary batteries is larger than a first threshold.

In the above aspect, the first voltage may be measured at a temperature of the first temperature ±5° C. in the process for measuring the first voltage.

In the above aspect, the inspection method may include a process for measuring a third voltage. The third voltage is a voltage of each of the plural secondary batteries that is measured under the second temperature after initiation of the second aging treatment process. The failure may be determined in the second determination process when a voltage difference between the third voltage and the second voltage in any of the plural secondary batteries is larger than a second threshold.

In the above aspect, the third voltage may be measured at a temperature of the second temperature ±5° C. in the process for measuring the third voltage. The second voltage may be measured at the temperature of the second temperature ±5° C. in the process for measuring the second voltage.

In the above aspect, the second determination process may include: a process for correcting the temperature dependency of the voltage difference between the first voltage and the second voltage in each of the plural secondary batteries; and a process for determining the failure if the voltage difference after correction in any of the plural secondary batteries is larger than the second threshold.

In the above aspect, the first temperature may be 40° C. to 80° C., and the second temperature may be 0° C. to 30° C.

In the above aspect, the second temperature may be higher than the first temperature by 20° C. or higher.

According to the invention, the inspection method for the secondary battery that can improve the inspection accuracy can be provided.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Overview of Embodiment

Hereinafter, a description will be made on a configuration of a secondary battery that is inspected in an embodiment and an overview of an inspection method of the embodiment.

Figure 1:
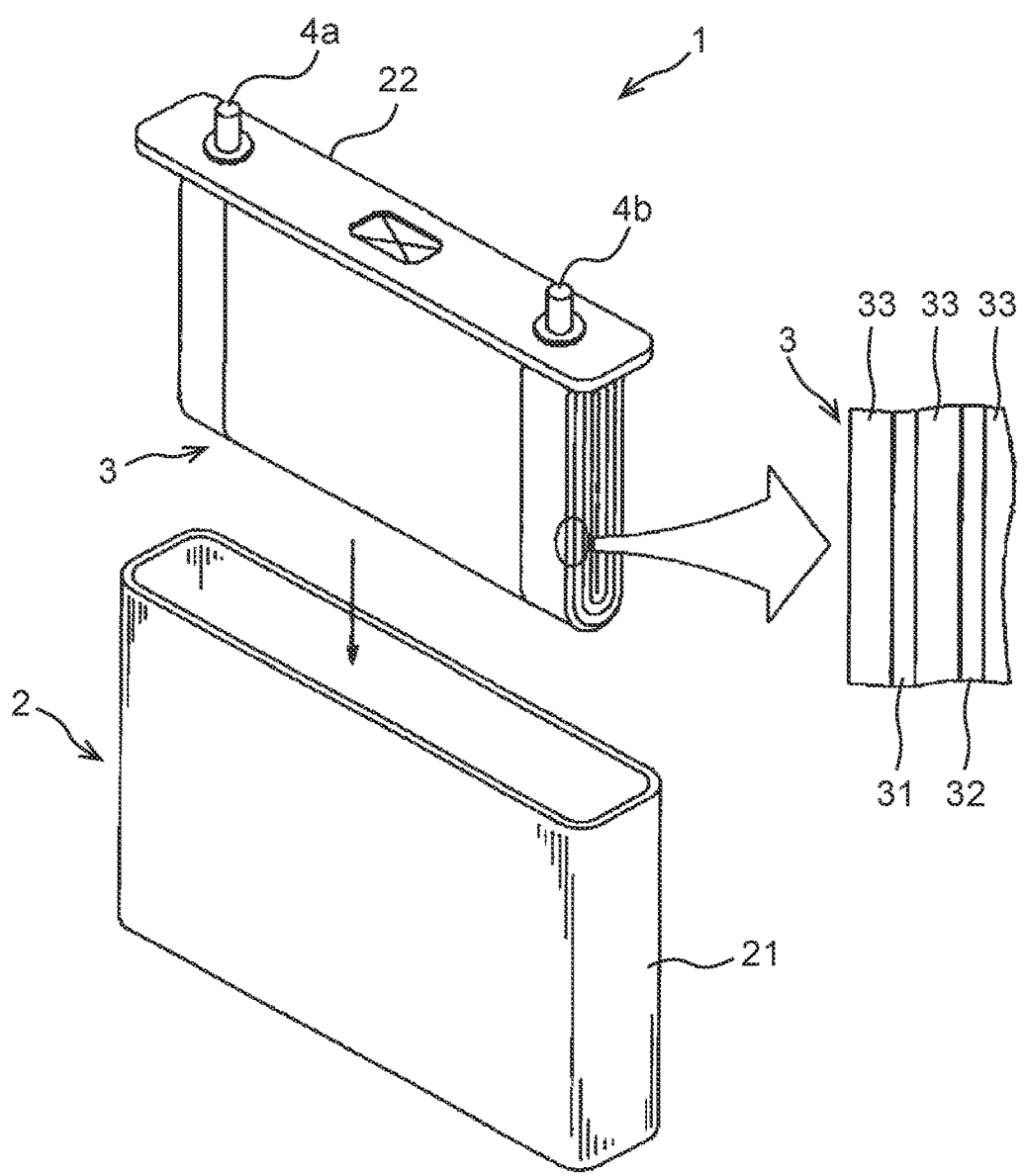
FIG. 1 is a perspective view of a configuration example of a secondary battery that is an inspection target of an inspection method for the secondary battery according to an embodiment.

<Configuration of Secondary Battery> FIG. 1 shows a schematic configuration of the secondary battery that is a target of an inspection method for the secondary battery according to the embodiment. This secondary battery is a nonaqueous electrolyte secondary battery like a lithium-ion secondary battery, for example. As shown in FIG. 1, a secondary battery 1 is configured that an electrode body 3 is accommodated together with an electrolyte in a battery case 2 that is configured by including a case body 21 in a bottomed square cylindrical shape, a surface (an upper surface) of which is opened, and a lid body 22 that is formed in a plate shape and closes an opening of the case body 21.

The battery case 2 is constructed as a square case in which the opening of the case body 21, which is formed into a bottomed square cylindrical shape of rectangular parallelepiped whose surface (the upper surface) is opened, is closed by the lid body 22 in the plate shape. A positive electrode terminal 4a is provided at one end of the lid body 22 in a longitudinal direction, and a negative electrode terminal 4b is provided at the other end of the lid body 22 in the longitudinal direction. The positive electrode terminal 4a and the negative electrode terminal 4b are voltage output terminals of a secondary battery 1, and a voltage of the secondary battery 1 is measured by connecting a voltmeter to the positive electrode terminal 4a and the negative electrode terminal 4b.

The electrode body 3 includes a positive electrode 31, a negative electrode 32, and a separator 33. The electrode body 3 is configured by stacking the positive electrode 31, the negative electrode 32, and the separator 33 such that the separator 33 is interposed between the positive electrode 31 and the negative electrode 32, and by rolling and flattening the stacked positive electrode 31, negative electrode 32, and separator 33.

When the secondary battery 1 is configured by accommodating the electrode body 3 and the electrolyte in the battery case 2, first, the positive electrode terminal 4a and the negative electrode terminal 4b of the lid body 22 are respectively connected to the positive electrode 31 and the negative electrode 32 of the electrode body 3, and the electrode body 3 is assembled to the lid body 22, so as to form a lid body sub-assembly. Thereafter, the electrode body 3 and the electrolyte are accommodated in the case body 21, the lid body 22 is fitted to the opening of the case body 21, and the lid body 22 and the case body 21 are sealed by welding. In this way, the secondary battery 1 is constructed.

The positive electrode 31 is configured by applying a positive electrode mixture paste that is obtained by kneading electrode materials such as a positive electrode active material, a conductive material, and a binding material with a solvent to a surface (one surface or both surfaces) of a collector formed in a foil shape and drying and pressurizing the positive electrode mixture paste. Similarly, the negative electrode 32 is configured by applying a negative electrode mixture paste that is obtained by kneading electrode materials such as a negative electrode active material, a thickener, and the binding material to the surface (the one surface or both of the surfaces) of the collector formed in the foil shape and drying and pressurizing the negative electrode mixture paste. The separator 33 is a sheet-shaped member that is constructed of a porous polyolefin-based resin, for example, and is arranged between the positive electrode 31 and the negative electrode 32.

In the case where a conductive foreign material such as a metal is mixed in a portion between the positive electrode 31 and the negative electrode 32 of the electrode body 3 during manufacturing of the secondary battery 1, a conductive crystal grows from the conductive foreign material by the electrolyte and penetrates the separator 33. Failure of an internal short circuit of the positive electrode 31 and the negative electrode 32 caused by this is referred to as short-circuit failure. When the short-circuit failure occurs, a self-discharge amount of the secondary battery is increased. Accordingly, when the secondary battery is left alone for a long time, a battery voltage of the secondary battery is lowered in comparison with a reference voltage. It should be noted that the "conductive foreign material" is a conductive material that does not contribute to battery reaction, a conductive material that inhibits the battery reaction, or the like.

In addition, manufacturing failure such as abnormal formation of the positive electrode 31, the negative electrode 32, or the separator 33 of the electrode body 3 itself or a deviation in a shape or a position of the positive electrode 31, the negative electrode 32, or the separator 33 possibly occurs during manufacturing of the secondary battery 1. Failure of an abnormal electric characteristic between the positive electrode 31 and the negative electrode 32 caused by such manufacturing failure is referred to as voltage lowering failure. In the case where the voltage lowering failure occurs, the self-discharge amount of the secondary battery is increased. Accordingly, when the secondary battery is left alone for the long time, the battery voltage of the secondary battery is lowered in comparison with the reference voltage.

In the embodiment, one inspection lot is constructed by the plural secondary batteries 1 (cells), and the plural secondary batteries 1 are collectively inspected per inspection lot. A "variation" in the secondary battery or that the secondary battery "varies" means a "variation" in individual pieces of the plural secondary batteries 1 or that the individual pieces of the plural secondary batteries 1 "vary".

Figure 2:
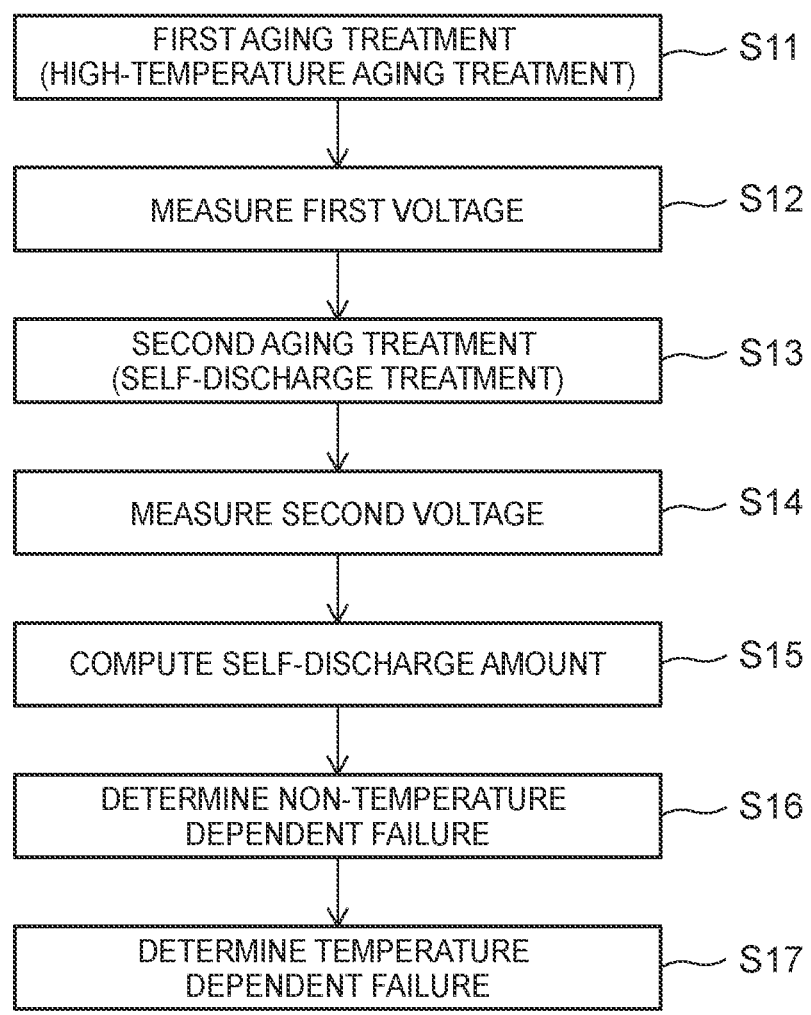
FIG. 2 is a flowchart of an overview of the inspection method for the secondary battery according to the embodiment.

<Inspection Method of Embodiment> FIG. 2 is a flowchart of an overview of the inspection method for the secondary battery according to the embodiment. As shown in FIG. 2, in the inspection method for the secondary battery according to the embodiment, a first aging treatment process S11, a first voltage measurement process S12, a second aging treatment process S13, a second voltage measurement process S14, a self-discharge amount computation process S15, a non-temperature dependent failure determination process S16, and a temperature dependent failure determination process S17 are sequentially executed.

In the first aging treatment process S11, as first aging treatment (high-temperature aging treatment), the secondary battery that has initially been charged is stored for a specified time under a first temperature of 40° C. to 80° C. as a high temperature, for example. In the first voltage measurement process S12, a first voltage (a voltage Va) of the secondary battery is measured at the first temperature of 40° C. to 80° C., for example, after the first aging treatment process. In the second aging treatment process S13, as second aging treatment (low-temperature aging treatment), the secondary battery that has been subjected to the first aging treatment is stored for a specified time under a temperature of 0° C. to 30° C. that is lower than the first temperature, for example, so as to cause self-discharge of the secondary battery. In the second voltage measurement process S14, a second voltage (a voltage Vb) of the secondary battery is measured after the second aging treatment process.

The self-discharge amount computation process S15, the non-temperature dependent failure determination process S16, and the temperature dependent failure determination process S17 are quality determination processes in which a quality determination of the secondary battery is made in accordance with the self-discharge amount of the secondary battery in the second aging treatment process.

In the self-discharge amount computation process S15, a voltage difference between the first voltage and the second voltage is computed as the self-discharge amount of the secondary battery in the second aging treatment process. In the non-temperature dependent failure determination process (a first determination process) S16, as non-temperature dependent failure (first failure) that does not depend on a relationship between the self-discharge amount and a temperature (a difference between a temperature during measurement of the first voltage and a temperature during measurement of the second voltage), the short-circuit failure caused by mixture of the foreign material, for example, is determined in accordance with the measured self-discharge amount of the secondary battery.

In the temperature dependent failure determination process (a second determination process) S17, as temperature dependent failure (second failure) that depends on the relationship between the self-discharge amount and the temperature (the difference between the temperature during the measurement of the first voltage and the temperature during the measurement of the second voltage), the voltage lowering failure caused by the manufacturing failure, for example, is determined in accordance with the self-discharge amount, temperature dependency of which is suppressed. In one example, the temperature dependency is suppressed by using a voltage difference between a third voltage (a voltage Vc) of the secondary battery that is measured at the temperature of 0° C. to 30° C. after initiation of the second aging treatment and the second voltage of the secondary battery that is measured after the second aging treatment. In another example, the temperature dependency is suppressed by correcting the voltage difference between the first voltage of the secondary battery that is measured at the temperature of 40° C. to 80° C. after the first aging treatment and the second voltage of the secondary battery that is measured after the second aging treatment.

As described above, in the embodiment, the first aging treatment and the second aging treatment are performed on the secondary battery. In addition, the non-temperature dependent failure such as the short-circuit failure is determined in accordance with a measurement value of the self-discharge amount in the inspection method for making the quality determination in accordance with the self-discharge amount in the second aging treatment. Furthermore, the temperature dependent failure such as the voltage lowering failure is determined in accordance with the self-discharge amount, the temperature dependency of which is suppressed. In this way, the determinations of the non-temperature dependent failure and the temperature dependent failure are separated from each other, and the determination that corresponds to each type of the failure can be made. Thus, inspection accuracy can be improved.

First Embodiment

Hereinafter, a first embodiment will be described with reference to the drawings.

Figure 3:
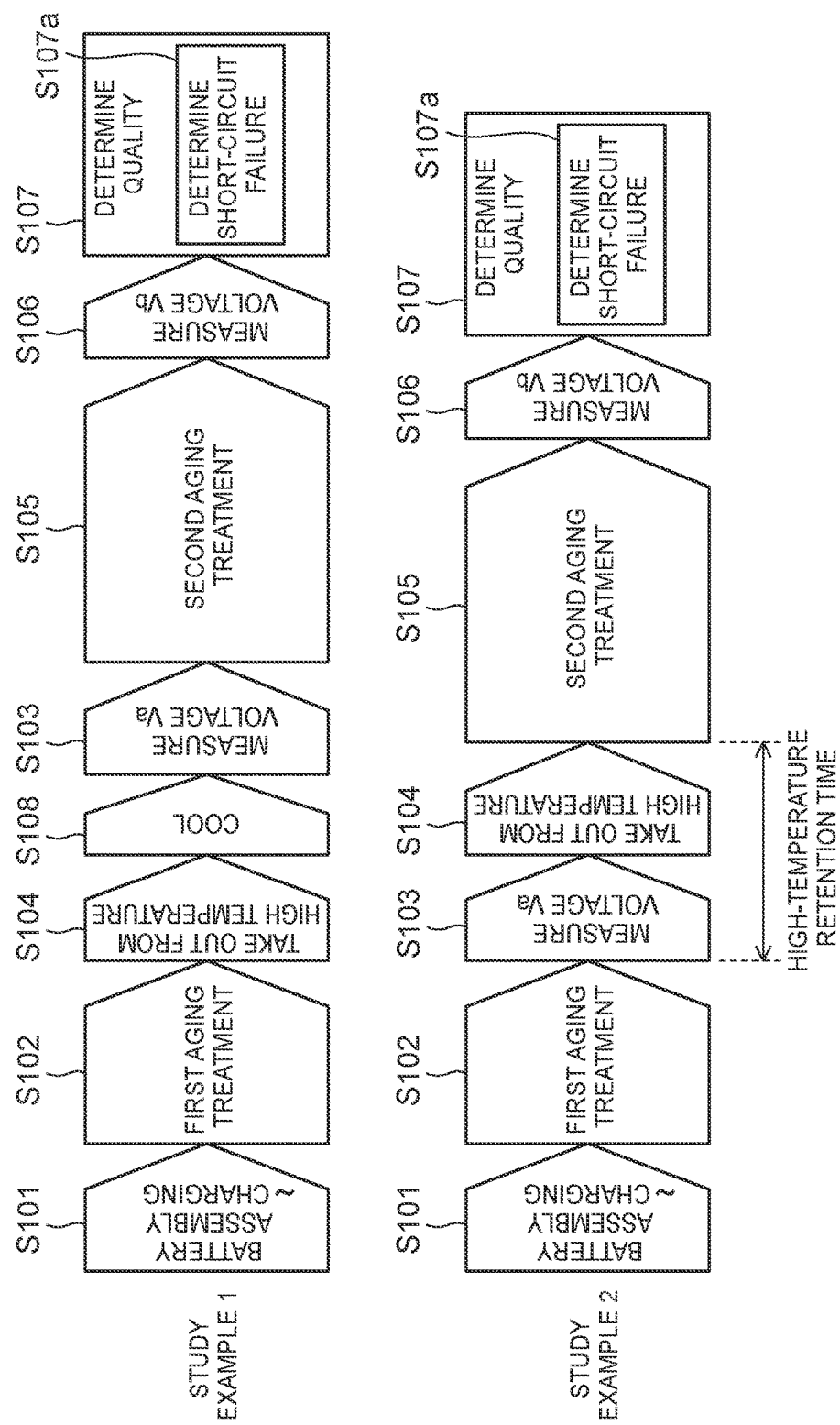
FIG. 3 includes process diagrams in each of which the inspection method for the secondary battery in a study example is shown in a process order.

<Study That Led to Embodiment> First, study examples 1 and 2 in which the inventors conducted studies until reaching the embodiment will be described. FIG. 3 shows the inspection methods for the secondary battery in the study examples 1 and 2 in a process order.

As shown in FIG. 3, in the inspection method for the secondary battery in the study example 1, the secondary battery 1 is assembled and initially charged (S101), the first aging treatment is performed on the secondary battery 1 that has initially been charged for a specified time under an environment of 40° C. to 80° C. (S102), and the secondary battery 1 is taken out from a high-temperature environment (S104). After the secondary battery 1 that has been taken out is cooled for a specified time (S108), the voltage Va of the secondary battery 1 is measured under an environment of 20° C.±5° C. (S103). Next, after the second aging treatment is performed on the secondary battery 1 for a specified time under an environment of 0° C. to 30° C. (S105), the battery voltage Vb of the secondary battery 1 is measured (S106). Furthermore, the quality of the secondary battery 1 is determined by using the measured voltage Va and voltage Vb (S107). In this quality determination, if a voltage difference ΔV between the voltage Va and the voltage Vb is larger than a threshold, it is determined as the short-circuit failure (S107a).

Figure 4:
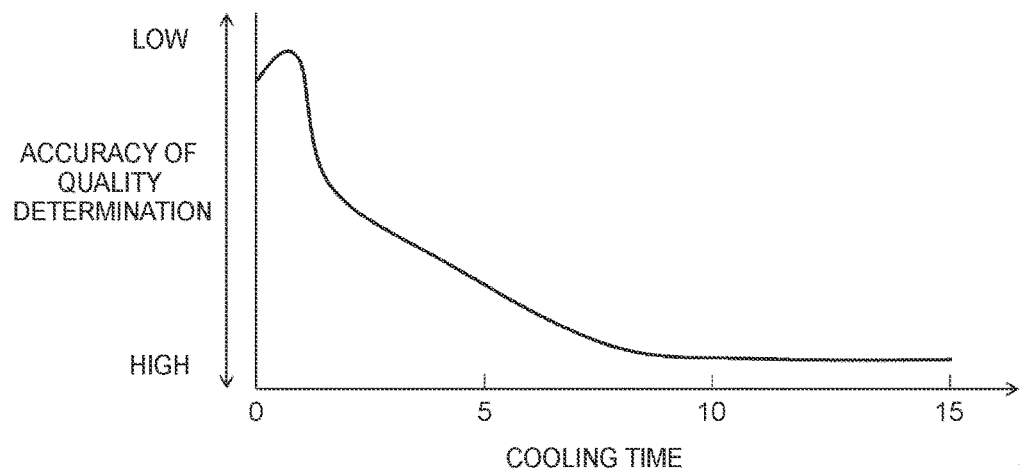
FIG. 4 is a graph of a relationship between a cooling time and accuracy of a quality determination of the secondary battery.
Figure 5:
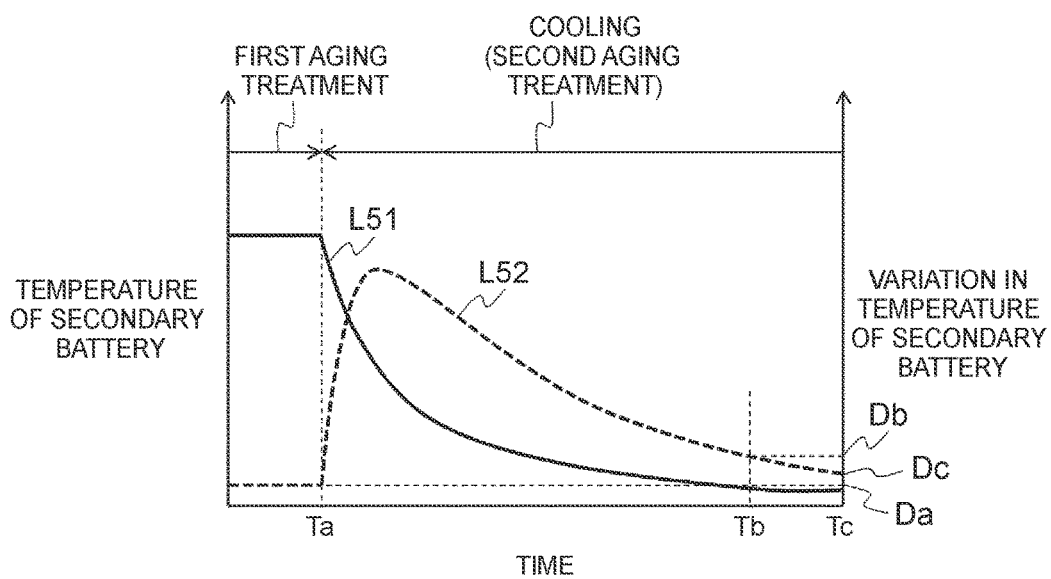
FIG. 5 is a graph of a relationship between each of a temperature of the secondary battery and a variation in the temperature of the secondary battery and time.
Figure 6:
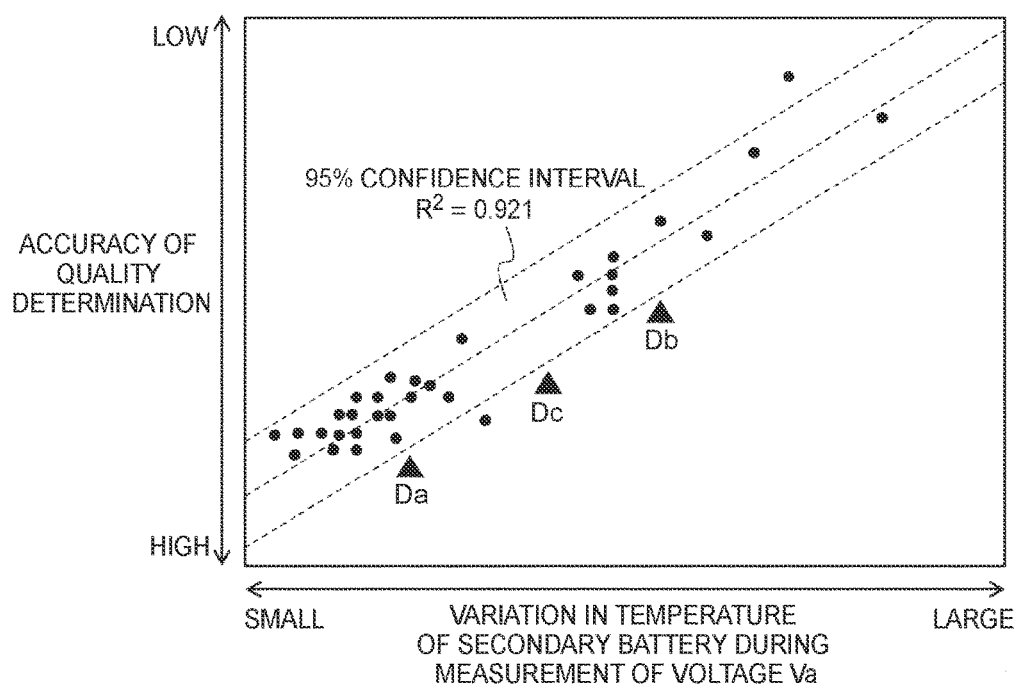
FIG. 6 is a graph of a relationship between the variation in the temperature of the secondary battery and the accuracy of the quality determination of the secondary battery.

The inspection method for the secondary battery in the study example 1 will be examined by using FIG. 4 to FIG. 6. A graph in FIG. 4 shows a measurement result of the quality determination of the secondary battery at each cooling time and shows a relationship between the cooling time and accuracy of the quality determination of the secondary battery. As shown in FIG. 4, the accuracy of the quality determination is lowered when the cooling time of the secondary battery is shortened, and the accuracy of the quality determination is increased as the cooling time is extended. Thus, in order to increase the accuracy of the quality determination of the secondary battery, the sufficient cooling time of the secondary battery needs to be secured, and it is especially preferred to set the cooling time to 10 hours or longer.

Meanwhile, as the cooling time of the secondary battery is extended, a required time for the inspection of the secondary battery is extended. As a result, production efficiency of the secondary battery is degraded. Accordingly, it is preferred to increase the accuracy of the quality determination of the secondary battery while preventing the required time for the inspection of the secondary battery from being extended. For this reason, shortening of the cooling time in the inspection method for the secondary battery in the study example 1 will be examined.

A graph in FIG. 5 shows a measurement result of the temperature of the secondary battery at each time and shows time dependency of each of the temperature of the secondary battery and a variation in the temperature of the secondary battery. In FIG. 5, L51 indicates a change in the temperature of the secondary battery, and L52 indicates a change in the variation in the temperature of the secondary battery. A graph in FIG. 6 shows a measurement result of the quality determination of the secondary battery in an environment in FIG. 5 and shows a relationship between the variation in the temperature of the secondary battery and the accuracy of the quality determination of the secondary battery during measurement of the voltage Va.

In a period of the first aging treatment, as indicated by L51 in FIG. 5, the temperature of the secondary battery is maintained to be constant. At this time, the variation in the temperature of the secondary battery is Da as indicated by L52 in FIG. 5 and thus is small. In the case where the quality of the secondary battery is determined at Ta that is after termination of the first aging treatment and before initiation of cooling of the secondary battery, the accuracy of the quality determination is high as indicated by Da in FIG. 6.

In addition, when the first aging treatment is terminated and cooling of the secondary battery is initiated, as indicated by L51 in FIG. 5, the temperature of the secondary battery is gradually lowered along with a lapse of time. At this time, as indicated by L52 in FIG. 5, the variation in the temperature of the secondary battery is rapidly increased immediately after the initiation of cooling of the secondary battery, and is thereafter gradually decreased along with the lapse of the time.

At Tb at which five hours have elapsed since the initiation of cooling of the secondary battery, as indicated by L51 in FIG. 5, the temperature of the secondary battery approaches a desired temperature (for example, a storage temperature of the secondary battery in the second aging treatment). However, as indicated by L52 in FIG. 5, the variation in the temperature of the secondary battery becomes Db and thus is larger than Da. In the case where the quality of the secondary battery is determined at a time point of this Tb, as indicated by Db in FIG. 6, the accuracy of the quality determination is significantly degraded in comparison with Da.

At Tc at which six hours have further elapsed since the initiation of cooling of the secondary battery, as indicated by L51 in FIG. 5, the temperature of the secondary battery is maintained at the desired temperature. In addition, as indicated by L52 in FIG. 5, the variation in the temperature of the secondary battery becomes Dc and thus is slightly smaller than Db. In the case where the quality of the secondary battery is determined at a time point of this Tc, as indicated by Dc in FIG. 6, the accuracy of the quality determination becomes slightly higher than Db but is lower than Da.

From what have been described so far, the inventors have found that the accuracy of the quality determination of the secondary battery can be improved when the variation in the temperature of the secondary battery during the measurement of the voltage Va can be suppressed to be small. Furthermore, the inventors have found that the variation in the temperature of the secondary battery is the smallest at time (Ta) that is after the termination of the first aging treatment and before the initiation of cooling of the secondary battery.

In view of the above, the inspection method for the secondary battery in the study example 2 is considered. As shown in FIG. 3, in the inspection method for the secondary battery in the study example 2, after the secondary battery 1 that has been assembled and initially charged (S101) is subjected to the first aging treatment for the specified time under the environment of 40° C. to 80° C. (S102), the voltage Va of the secondary battery 1 is measured under the temperature of 40° C. to 80° C. (S103). Next, after the secondary battery 1 is taken out from the high-temperature environment (S104) and the second aging treatment is performed on the secondary battery 1 for the specified time under the environment of 0° C. to 30° C. (S105), the battery voltage Vb of the secondary battery 1 is measured (S106). Furthermore, the quality of the secondary battery 1 is determined by using the measured voltage Va and voltage Vb (S107). In this quality determination, in the case where the voltage difference ΔV between the voltage Va and the voltage Vb is larger than the threshold, it is determined as the short-circuit failure (S107a).

In the study example 2, the voltage Va is measured under the same high-temperature environment as that in the first aging treatment after the first aging treatment. Thus, the variation in the temperature of the secondary battery during the measurement of the voltage Va can be prevented, and the accuracy of the quality determination of the secondary battery can be increased. In addition, because a cooling process as in the study example 1 can be eliminated, an inspection time can be shortened.

Meanwhile, a case where the short-circuit failure caused by mixture of the foreign material is inspected has been mainly described in the above study example 1 and study example 2. However, a case where the voltage lowering failure caused by the manufacturing failure is inspected is not considered. Thus, a case where the short-circuit failure and the voltage lowering failure are inspected by using the voltage Va that is measured under the high-temperature environment after the first aging treatment and the voltage Vb that is measured under a low-temperature environment after the second aging treatment in the study example 2 will be examined.

Figure 7:
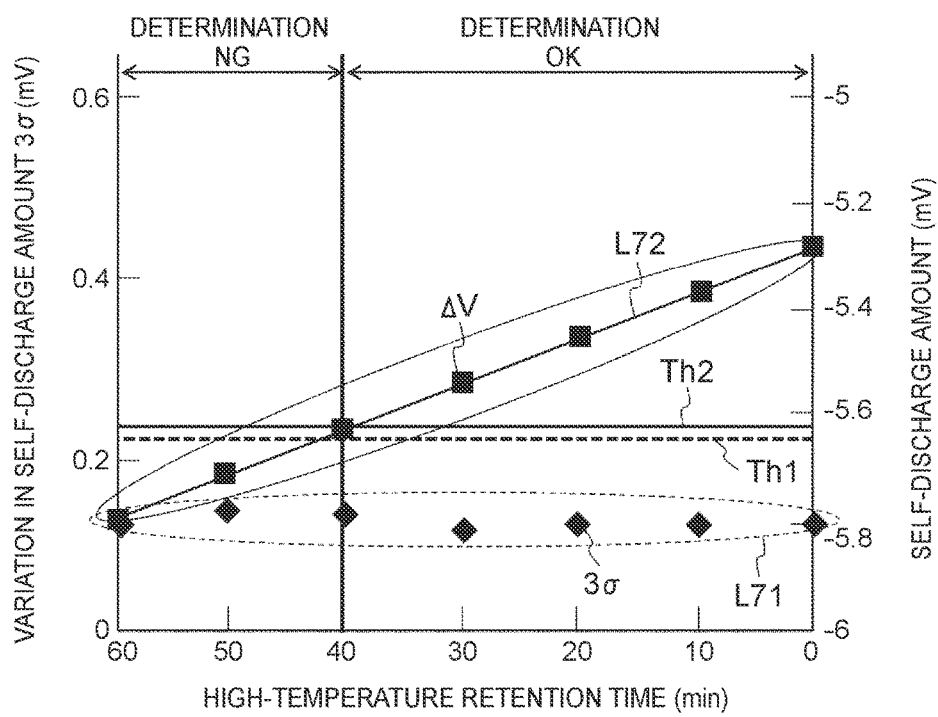
FIG. 7 is a graph of a relationship between each of a self-discharge amount of the secondary battery and a variation in the self-discharge amount and a high-temperature retention time.
Figure 8:
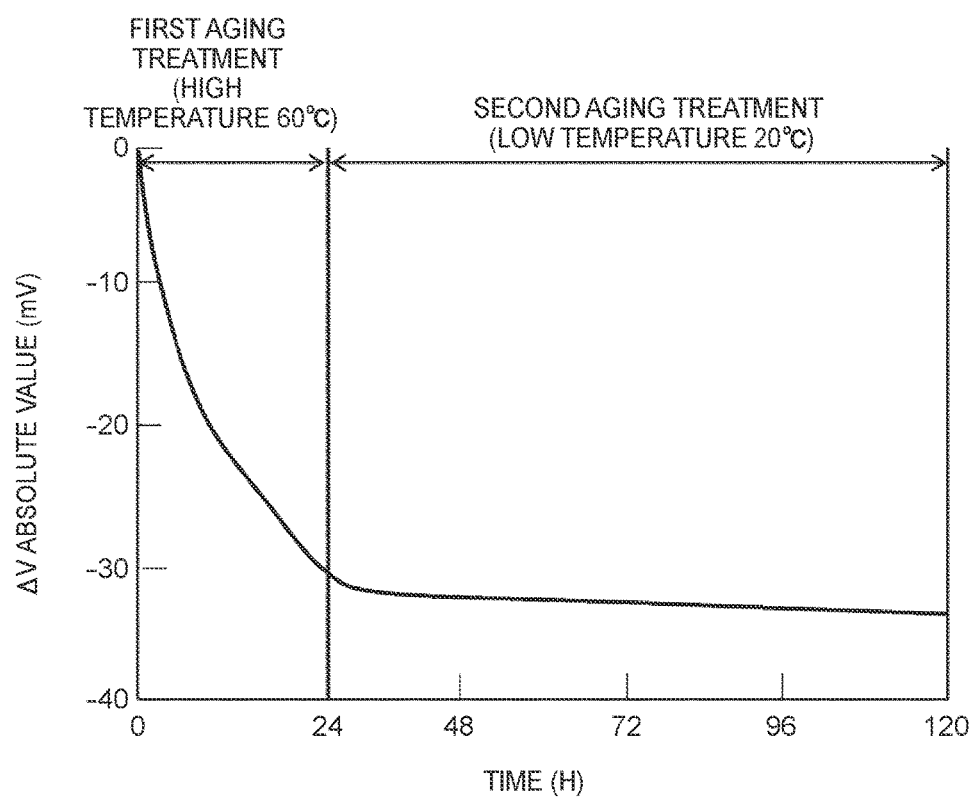
FIG. 8 is a graph of a relationship between a voltage lowering amount of the secondary battery and the time.

A graph in FIG. 7 shows a measurement result of the self-discharge amount of the secondary battery (a voltage difference between the voltage Va and the voltage Vb) at each high-temperature retention time in the study example 2 and shows a relationship between each of the self-discharge amount of the secondary battery and a variation in the self-discharge amount of the secondary battery and the high-temperature retention time. In addition, a graph in FIG. 8 shows a measurement result of the self-discharge amount of the secondary battery at each time and shows a relationship between an absolute value of the self-discharge amount of the secondary battery (a voltage lowering amount) and the time.

In FIG. 7, L71 indicates a variation $3\sigma$ in the self-discharge amount $\Delta V$ of the secondary battery, and L72 indicates the absolute value of the self-discharge amount $\Delta V$ of the secondary battery. This self-discharge amount (the voltage lowering amount) $\Delta V$ is a differential voltage between the voltage Va and the voltage Vb. It should be noted that the high-temperature retention time is a time from the measurement of the voltage Va after the first aging treatment (S103) to taking out the secondary battery from the high-temperature environment (S104).

As indicated by L71 in FIG. 7, the variation in the self-discharge amount $\Delta V$ exhibits substantially the same value regardless of the high-temperature retention time. This is because the variation in the temperature under the high-temperature environment after the first aging treatment is small as described above. For example, in the case where the threshold of the variation in $\Delta V$ that is used to determine the short-circuit failure is Th1 in FIG. 7, the measured variation in $\Delta V$ is smaller than the threshold Th1 for any high-temperature retention time. Thus, the short-circuit failure can be determined correctly.

Meanwhile, as indicated by L72 in FIG. 7, the absolute value of the self-discharge amount $\Delta V$ is decreased as the high-temperature retention time is extended. This is because, as shown in FIG. 8, compared to a case where the absolute value of the self-discharge amount $\Delta V$ is gradually decreased along with a lapse of time at a time of a low temperature in the second aging treatment, the absolute value of the self-discharge amount $\Delta V$ is rapidly decreased along with the lapse of the time at a time of the high temperature in the first aging treatment. That is, the voltage lowering amount at the time of the high temperature is approximately ten times larger than the voltage lowering amount at the time of the low temperature. Thus, an influence of the high-temperature retention time cannot be ignored.

For example, in the case where the threshold of the absolute value of $\Delta V$ that is used to determine the voltage lowering failure is Th2 in FIG. 7 and the high-temperature retention time is 0 to 40 minutes, the measured absolute value of $\Delta V$ is larger than the threshold Th2. Thus, the determination is OK, and the voltage lowering failure can be inspected correctly. However, in the case where the high-temperature retention time is 40 minutes or longer, the measured absolute value of $\Delta V$ becomes the threshold Th2 or smaller. Thus, the determination is not OK (NG), and the voltage lowering failure cannot be inspected correctly.

From what have been described so far, the inventors have found that the variation in the self-discharge amount does not depend on the high-temperature retention time (that is, not depend on the temperature) in the short-circuit failure caused by mixture of the foreign material and that the absolute value of the self-discharge amount depends on the high-temperature retention time (that is, depends on the temperature) in the voltage lowering failure caused by the manufacturing failure. It should be noted that, because the self-discharge amount corresponds to the voltage difference between the voltage Va and the voltage Vb, it can be said that the short-circuit failure does not depend on a relationship between the self-discharge amount and a temperature difference between the temperature during the measurement of the voltage Va and the temperature during the measurement of the voltage Vb but the voltage lowering failure depends on the relationship between the self-discharge amount and the temperature difference between the temperature during the measurement of the voltage Va and the temperature during the measurement of the voltage Vb. Just as described, in the study example 2 in which the voltage Va is measured under the high-temperature environment, the short-circuit failure can accurately be inspected; however, the inspection accuracy cannot be secured for the voltage lowering failure caused by the manufacturing failure. In view of this, the first embodiment allows improvement in the inspection accuracy of the short-circuit failure and the voltage lowering failure.

<Inspection Method According to First Embodiment>

Figure 9:
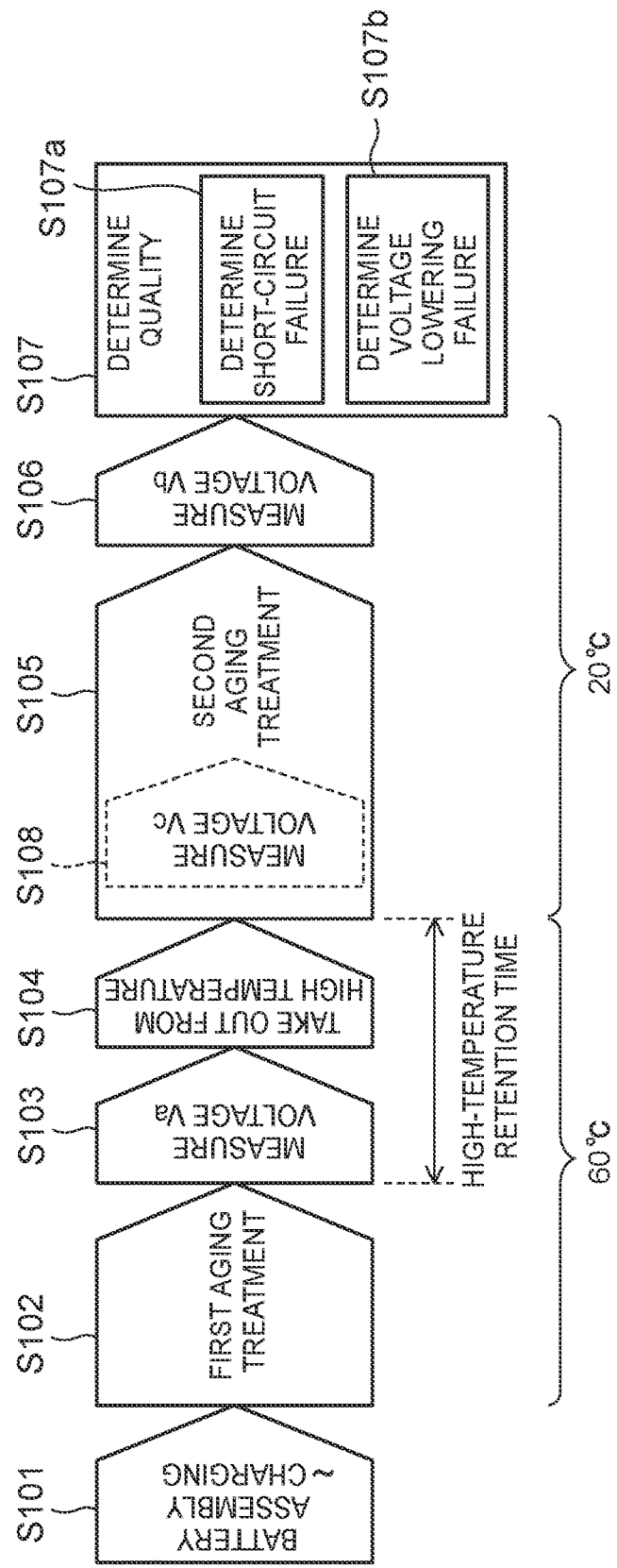
FIG. 9 is a process diagram in which an inspection method for a secondary battery according to a first embodiment is shown in a process order.

FIG. 9 shows a flow of the inspection method for the secondary battery according to the first embodiment. As shown in FIG. 9, in the inspection method for the secondary battery according to this embodiment, first, the battery is assembled and charged (S101). After the assembly of the secondary battery 1 is completed as in above FIG. 1, the plural secondary batteries 1 of the inspection lot are initially charged to an arbitrary voltage value.

Next, the first aging treatment process in which the first aging treatment is performed on each of the secondary batteries 1 that have initially been charged, under the high-temperature environment is executed (S102). The secondary batteries are stored for a specified time (for example, 10 hours to 200 hours) under the temperature of 40° C. to 80° C.

Figures 10, 11:
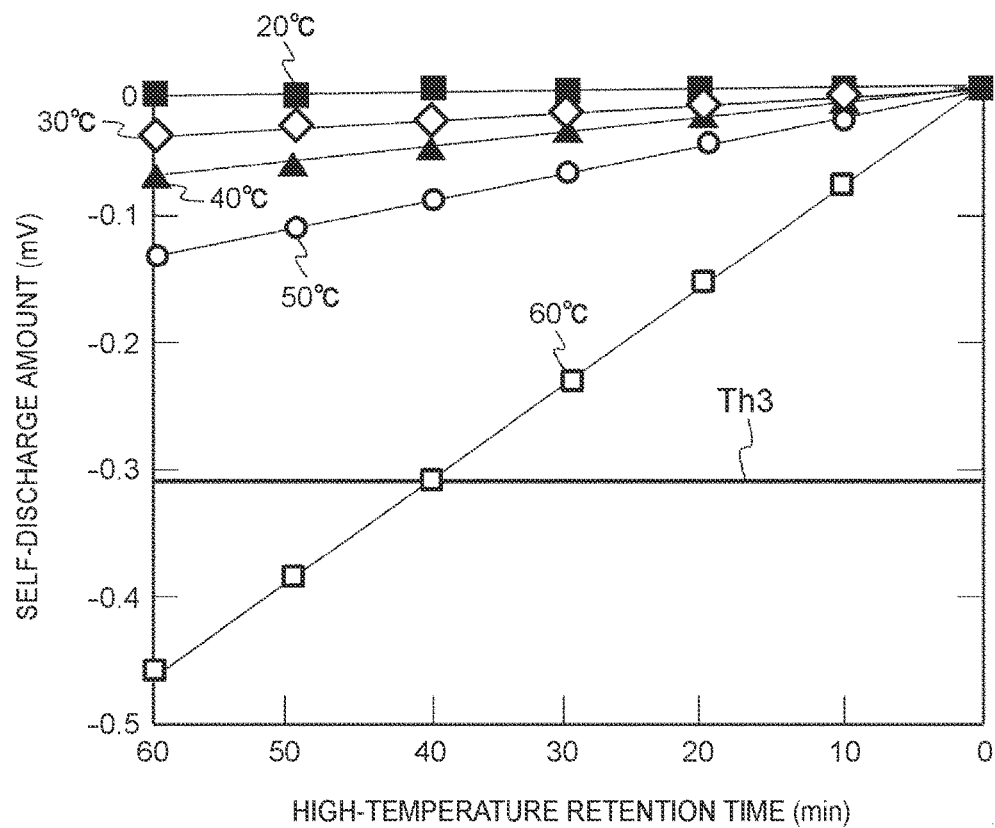
FIG. 10 is a graph of a relationship between the self-discharge amount of the secondary battery at each temperature in high-temperature aging treatment and the high-temperature retention time.
FIG. 11 is a table that shows a high-temperature retention permissible time at each of the temperatures in the high-temperature aging treatment.

FIG. 10 shows a measurement result of the self-discharge amount of the secondary battery for each of the high-temperature retention times in the case where the first aging treatment (the high-temperature aging treatment) is performed under the different temperatures, and shows a relationship between the high-temperature retention time and the self-discharge amount for each performance of the high-temperature aging treatment. In FIG. 10, measurements are made by setting temperatures of the first aging treatment to 20° C., 30° C., 40° C., 50° C., and 60° C. and setting a temperature of the second aging treatment to 20° C. As the temperature of the first aging treatment is increased, a reduction in the self-discharge amount with respect to the high-temperature retention time is increased (an inclination becomes steep).

For example, in the case where the threshold of ΔV that is used to determine the voltage lowering failure is Th3 in FIG. 10, the quality can be determined correctly when the self-discharge amount is larger than the threshold Th3. When the high-temperature retention time in which the quality determination can be made correctly, that is, the high-temperature retention time that is permitted for the inspection is computed for each of the temperatures of the first aging treatment from FIG. 10, results as shown in FIG. 11 is produced. Under such a condition that the temperature of the second aging treatment is set to 20° C., a high-temperature retention permissible time is 0.6 h in the case of 60° C. in the first aging treatment, and the high-temperature retention permissible time is 5 h in the case of 40° C. in the first aging treatment, for example. In consideration of dealing with a manufacturing defect, the temperature of the first aging treatment is preferably 40° C. or higher (a temperature difference from the second aging treatment is 20° C. or higher when the temperature of the second aging treatment is set to 20° C.).

In this example, the temperature of the second aging treatment is set to 20° C., and the temperature of the first aging treatment is set to 60° C. In the first aging treatment process, the plural secondary batteries that have initially been charged are stored in a thermostatic bath that is set at a temperature of 60° C. for a specified time.

Next, a voltage measurement process for measuring the voltage Va (the first voltage) of each of the secondary batteries 1 that have been subjected to the first aging treatment is executed (S103). The voltage Va is measured at the temperature of 40° C. to 80° C., and the voltage Va is preferably measured at the same temperature as the storage temperature of the secondary battery in the first aging treatment process (for example, 60° C.). In this process, the battery voltage of the secondary battery that is after termination of the first aging treatment process and before initiation of the second aging treatment process (a post-first aging treatment termination voltage or an ante-second aging treatment initiation voltage) is computed. In the voltage measurement process, the voltage Va is measured by connecting the voltmeter to each of the secondary batteries 1.

Next, a high-temperature taking out process for taking out each of the secondary batteries 1, the voltage Va of which has been measured, from the high-temperature environment is executed (S104). The second aging treatment is performed under the low-temperature environment after the first aging treatment is performed under the high-temperature environment. Thus, the secondary batteries are taken out from the high-temperature thermostatic bath.

Next, the second aging treatment process for performing the second aging treatment on each of the secondary batteries 1 that have been taken out under the low-temperature environment is executed to cause the self-discharge of each of the secondary batteries (S105). The secondary batteries are stored for a specified time (for example, 24 hours to 240 hours) at the temperature of 0° C. to 30° C. As described above, the temperature of the second aging treatment preferably differs from the temperature of the first aging treatment by 20° C. or higher and is 20° C., for example. In the second aging treatment process, the secondary batteries are stored for a specified time in the thermostatic bath that is set at a temperature of 20° C.

In addition, the voltage measurement process for measuring the voltage Vc (the second voltage) of each of the secondary batteries 1 at specified timing is executed after the initiation of the second aging treatment process (S108). The voltage Vc that is a post-second aging treatment initiation voltage is measured at the temperature of 0° C. to 30° C., that is, the voltage Vc is measured under the temperature of the second aging treatment process (for example, 20° C.). The voltage Vc is preferably measured at timing at which the second aging treatment is initiated and the voltage lowering amount becomes stable under the low-temperature environment. For example, the voltage Vc is measured 1 hour to 2 hours after the initiation of the second aging treatment (25 hours to 26 hours after initiation of the first aging treatment in the case where the first aging treatment takes 24 hours). Similar to the voltage Va, the voltage Vc is measured by connecting the voltmeter to each of the secondary batteries 1.

Next, the voltage measurement process for measuring the voltage Vb (the third voltage) of each of the secondary batteries 1 that have been subjected to the second aging treatment is executed (S106). The voltage Vb that is a post-second aging treatment termination voltage is measured at the temperature of 0° C. to 30° C., that is, the voltage Vb is measured under the same temperature as that in the second aging treatment process (for example, 20° C.). Similar to the voltages Va and Vc, the voltage Vb is measured by connecting the voltmeter to each of the secondary batteries 1.

Next, after the voltage Vb is measured, the quality determination of each of the secondary batteries 1 is made (S107). In this embodiment, as the quality determination process, a short-circuit failure determination (S107a) and a voltage lowering failure determination (S107b) are made.

In the short-circuit failure determination in S107a, presence or absence of the short-circuit failure of the secondary battery is determined by using the voltage Va, which is measured in S103, and the voltage Vb, which is measured in S106. That is, the differential voltage ΔV between the voltage Va after the first aging treatment and the voltage Vb after the second aging treatment is computed. If ΔV is equal to the threshold or smaller, it is determined that the secondary battery is a good product. If ΔV is larger than the threshold, it is determined that the secondary battery is defective. In particular, the variation (for example, 3σ) in the differential voltages ΔV (=Va−Vb) of the plural secondary batteries of the inspection lot is computed. If the variation in ΔV is equal to the threshold or smaller, it is determined that the inspection lot is a good product, that is, the short-circuit failure caused by mixture of the foreign material is absent. If the variation in ΔV is larger than the threshold, it is determined that the inspection lot is defective, that is, the short-circuit failure caused by mixture of the foreign material is present.

In the voltage lowering failure determination in S107b, presence or absence of the voltage lowering failure of the secondary battery is determined by using the voltage Vc, which is measured in S108, and the voltage Vb, which is measured in S106. That is, the differential voltage ΔV between the voltage Vc after the initiation of the second aging treatment and the voltage Vb after the second aging treatment is computed. If ΔV is equal to the threshold or smaller, it is determined that the secondary battery is the good product. If ΔV is larger than the threshold, it is determined that the secondary battery is defective. In particular, the differential voltages ΔV(=Vc−Vb) of the plural secondary batteries of the inspection lot are computed. If ΔV of all of the secondary batteries of the inspection lot are equal to the threshold or smaller, it is determined that the inspection lot is the good product, that is, the voltage lowering failure caused by the manufacturing failure is absent. If ΔV of any of the secondary batteries of the inspection lot is larger than the threshold, it is determined that the inspection lot is defective, that is, the voltage lowering failure caused by the manufacturing failure is present.

Figure 12:
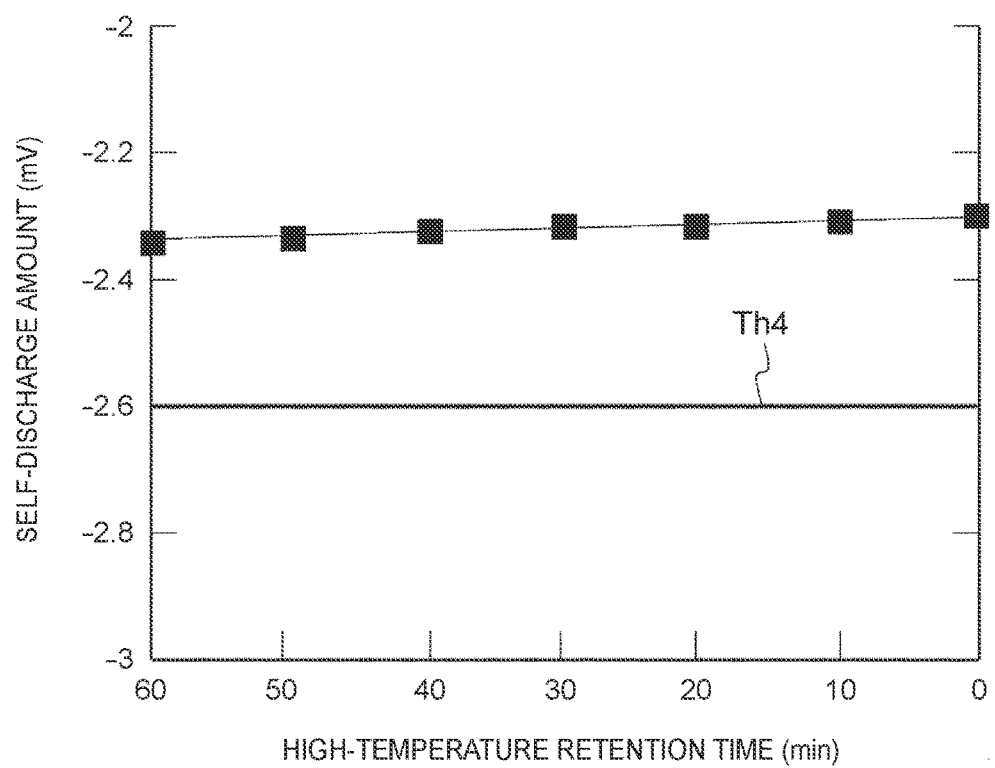
FIG. 12 is a graph of a relationship between the self-discharge amount and the high-temperature retention time by the inspection method for the secondary battery according to the first embodiment.

A graph in FIG. 12 shows a measurement result of a differential voltage (a self-discharge amount) between the voltage Vc and the voltage Vb for each of the high-temperature retention times and shows a relationship between each of the self-discharge amounts by the voltage Vc and the voltage Vb and the high-temperature retention time. As shown in above FIG. 7, the self-discharge amount that is the differential voltage between the voltage Va and the voltage Vb is significantly decreased in accordance with the high-temperature retention time. On the other hand, in this embodiment, as shown in FIG. 12, the self-discharge amount by the voltage Vc and the voltage Vb is hardly changed even when the high-temperature retention time differs. That is, high-temperature retention time dependency (that is, the temperature dependency) of the self-discharge amount as in FIG. 7 is significantly suppressed in FIG. 12. For example, while the self-discharge amount in FIG. 7 is y=−0.00828x−5.28907, the self-discharge amount in FIG. 12 is y=−0.0007x−2.3014. Accordingly, in the case where a threshold that is used to determine the voltage lowering failure is Th4 in FIG. 12, the measured absolute value of ΔV is constantly larger than the threshold Th4. Thus, the voltage lowering failure can be inspected correctly.

It should be noted that any one of the short-circuit failure determination and the voltage lowering failure determination may be made before or after the other or may be made simultaneously. In addition, it may be determined that the inspection lot is defective if it is determined in S107a that the short-circuit failure is present and it is determined in S107b that the voltage lowering failure is present. That is, in the case where the variation in the differential voltages ΔV between the voltages Va and the voltages Vb of the plural secondary batteries is larger than the threshold and where the differential voltage ΔV between the voltage Vc and the voltage Vb of any secondary battery of the plural secondary batteries is larger than the threshold, it is determined that the inspection lot is defective.

Figure 13:
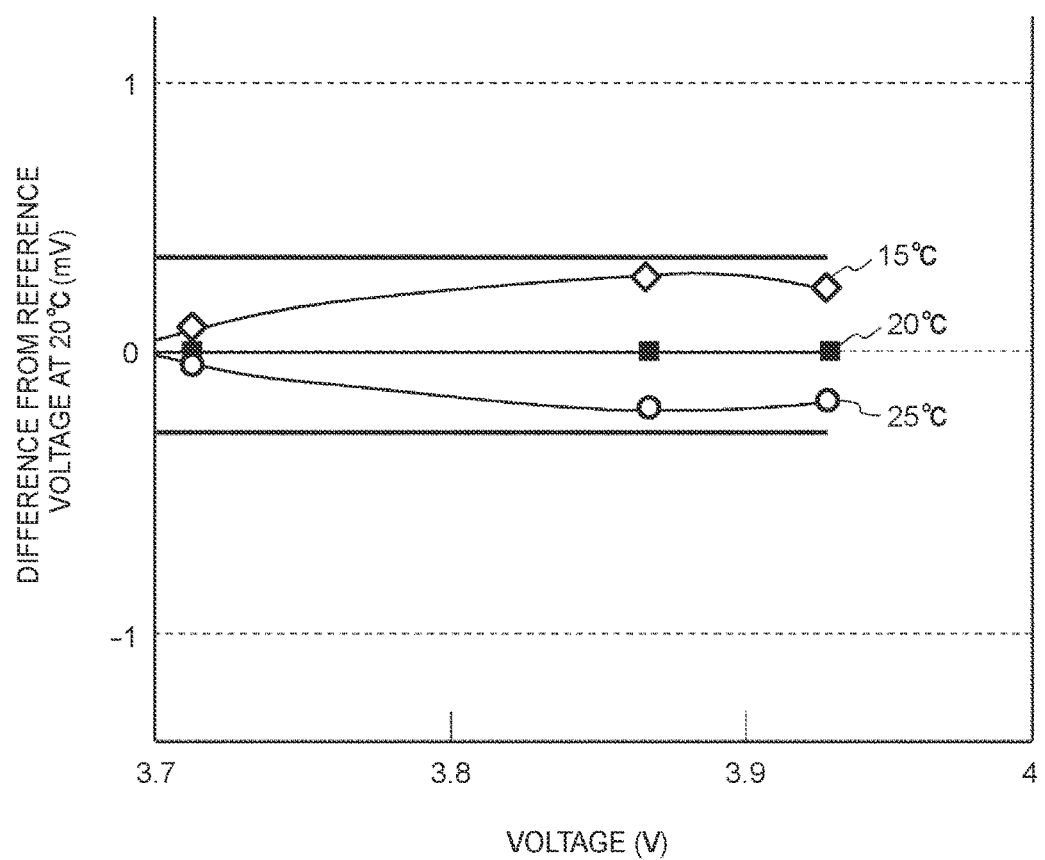
FIG. 13 is a graph of a relationship between a measured voltage of the secondary battery and a difference thereof from a reference voltage at each measured temperature.

Here, the temperature during the measurement of each of the voltages Va, Vb, and Vc is set to fall within a specified range from the temperature of the aging treatment. FIG. 13 shows measurement results of the voltage at temperatures within ±5° C. from a reference temperature and shows a relationship between the measured voltage at each of the temperatures and a difference from a reference voltage.

As shown in FIG. 13, in the case where the reference voltage is measured at the reference temperature of 20° C. and the voltage is measured at the temperatures from 15° C. to 25° C., a fluctuation in measurement values can be suppressed to fall within a constant range (for example, ±0.3 mV or smaller). Thus, the temperature during the measurement of each of the voltages Va, Vb, and Vc preferably falls within a range of ±5° C. from the temperature of the aging treatment. In this way, because a fluctuation in each of the voltages Va, Vb, and Vc can be suppressed, the quality can accurately be determined. By measuring the voltage Va at the temperature of the first aging treatment ±5° C., a variation in the temperature of each of the secondary batteries can be maintained to be small after the first aging treatment. Thus, accuracy of the short-circuit failure determination is improved. By measuring the voltage Vb and the voltage Vc at the temperature of the second aging treatment ±5° C., a change in the temperature from the measurement of the voltage Vb to that of the voltage Vc can be suppressed to be small. Thus, accuracy of the voltage lowering failure determination can be improved.

As it has been described so far, in this embodiment, the voltage Va is measured under the high-temperature environment after the first aging treatment, and the short-circuit failure caused by mixture of the foreign material is determined by using the differential voltage (the self-discharge amount) between the voltage Va and the voltage Vb after the second aging treatment. In this way, similar to the above study example 2, because the variation in the temperature of the secondary battery during the measurement of the voltage Va can be suppressed, the quality determination of the short-circuit failure can accurately be made. In addition, compared to the study example 1, because the cooling process after the first aging treatment is unnecessary, an inspection time of the secondary battery can be shortened.

Furthermore, in this embodiment, the voltage Vc is measured at the timing at which a fluctuation in the self-discharge amount after the initiation of the second aging treatment becomes stable, and the voltage lowering failure caused by the manufacturing failure is determined by using the differential voltage (the self-discharge amount) between the voltage Vc and the voltage Vb after the second aging treatment. In this way, temperature changes during the measurement of the voltage Vc and that of the voltage Vb are small, and the quality can be determined in a state where the fluctuation in the self-discharge amount that is influenced by the temperature change is suppressed. Thus, the quality determination of the voltage lowering failure can accurately be made.

Second Embodiment

Figure 14:
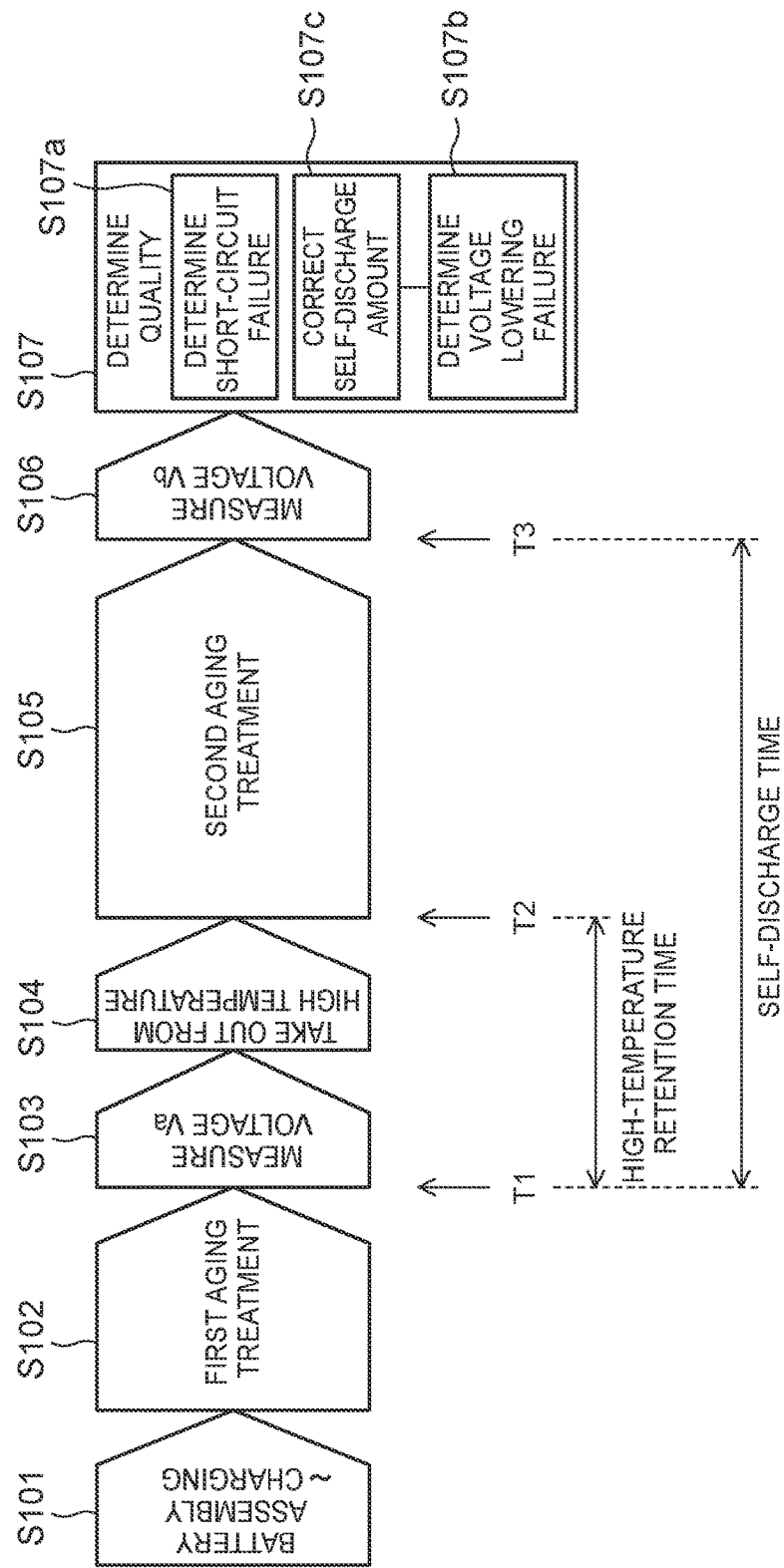
FIG. 14 is a process diagram in which an inspection method for a secondary battery according to a second embodiment is shown in a process order.

A second embodiment will hereinafter be described with reference to the drawings. FIG. 14 shows a flow of an inspection method for the secondary battery according to the second embodiment. The processes in S101 to S107a are similar to those in the first embodiment in FIG. 9. Thus, a description will mainly be made on portions that differ from the first embodiment.

That is, in this embodiment, as shown in FIG. 14, the secondary batteries are assembled and charged (S101), the first aging treatment is performed on each of the secondary batteries under the high-temperature environment (S102), the voltage Va of each of the secondary batteries 1 is measured (S103), and each of the secondary batteries 1 is taken out from the high-temperature environment (S104). Next, the second aging treatment is performed on each of the secondary batteries under the low-temperature environment (S105), and the voltage Vb of each of the secondary batteries 1 is measured (S106). It should be noted that the measurement of the voltage Vc during the second aging treatment as in the first embodiment is unnecessary.

Then, after the voltage Vb is measured, the quality determination of each of the secondary batteries 1 is made (S107). In this embodiment, as the quality determination process, the short-circuit failure determination (S107a), self-discharge amount correction (S107c), and the voltage lowering failure determination (S107b) are made.

In the short-circuit failure determination in S107a, similar to the first embodiment, the short-circuit failure is determined by using the differential voltage ΔV between the voltage Va after the first aging treatment, which is measured in S103, and the voltage Vb after the second aging treatment, which is measured in S106.

In S107c and S107b, the voltage lowering failure is determined by using the voltage Va after the first aging treatment, which is measured in S103, and the voltage Vb after the second aging treatment, which is measured in S106. First, in S107c, the self-discharge amount that is the differential voltage between the voltage Va after the first aging treatment and the voltage Vb after the second aging treatment is corrected. That is, the absolute value of the differential voltage ΔV between the voltage Va and the voltage Vb is corrected in accordance with the high-temperature retention time.

In this embodiment, a correction equation for correcting the self-discharge amount is obtained in advance. S101 to S106 are executed by using a reference battery, the self-discharge time of which is constant, an equation of the self-discharge amount with respect to the high-temperature retention time as indicated by L72 in FIG. 7 is obtained, and the correction equation is determined on the basis of this equation. More specifically, the correction equation is obtained as described below. It should be noted that a correlation coefficient between the high-temperature retention time and the self-discharge amount (ΔV) is $R^2$>0.9. 1. Time at which the voltage Va is measured in S103 is set as T1 (FIG. 14), time at which the secondary batteries are taken out from the high temperature environment in S104 is set as T2 (FIG. 14), and time at which the voltage Vb is measured in S106 is set as T3 (FIG. 14). The high-temperature retention time=the time T2−the time T1, the self-discharge time=the time T3−the time T1, and the self-discharge amount=the voltage Vb−the voltage Va. 2. The following equation (1) that indicates the relationship between the high-temperature retention time and the self-discharge amount is obtained from a measurement result of the reference battery. The self-discharge amount (the measurement value)=α×the high-temperature retention time+the self-discharge amount with the high-temperature retention time as 0 . . . the equation (1). For example, in an example of L72 in FIG. 7, α=−0.00828, $R^2$=0.99998. 3. By using the coefficient α that is obtained by the equation (1), the correction equation is set as the following equation (2). The self-discharge amount (a calculation value)=−α×the high-temperature retention time+the self-discharge amount (the measurement value) . . . the equation (2). For example, the correction equation for correcting L72 in FIG. 7 is the self-discharge amount (the calculation value)=−0.00828×the high-temperature retention time+the self-discharge amount (the measurement value).

In S107c, the measurement value is corrected by using the above equation (2). That is, the self-discharge amount that is the difference between the voltage Va and the voltage Vb and the high-temperature retention time are assigned to the equation (2), and the self-discharge amount after correction is computed.

Next, in S107b, the presence or the absence of the voltage lowering failure is determined by using the corrected self-discharge amount. That is, if the corrected self-discharge amount ΔV is equal to the threshold or smaller, it is determined that the secondary battery is the good product. If the corrected self-discharge amount ΔV is larger than the threshold, it is determined that the secondary battery is defective. In particular, regarding correction values of the differential voltages ΔV (=Va−Vc) of the plural secondary batteries of the inspection lot, if ΔV after the correction of all of the secondary batteries of the inspection lot are equal to the threshold or smaller, it is determined that the inspection lot is the good product, that is, the voltage lowering failure caused by the manufacturing failure is absent. If ΔV after the correction of any of the secondary batteries of the inspection lot is larger than the threshold, it is determined that the inspection lot is defective, that is, the voltage lowering failure caused by the manufacturing failure is present.

Figure 15:
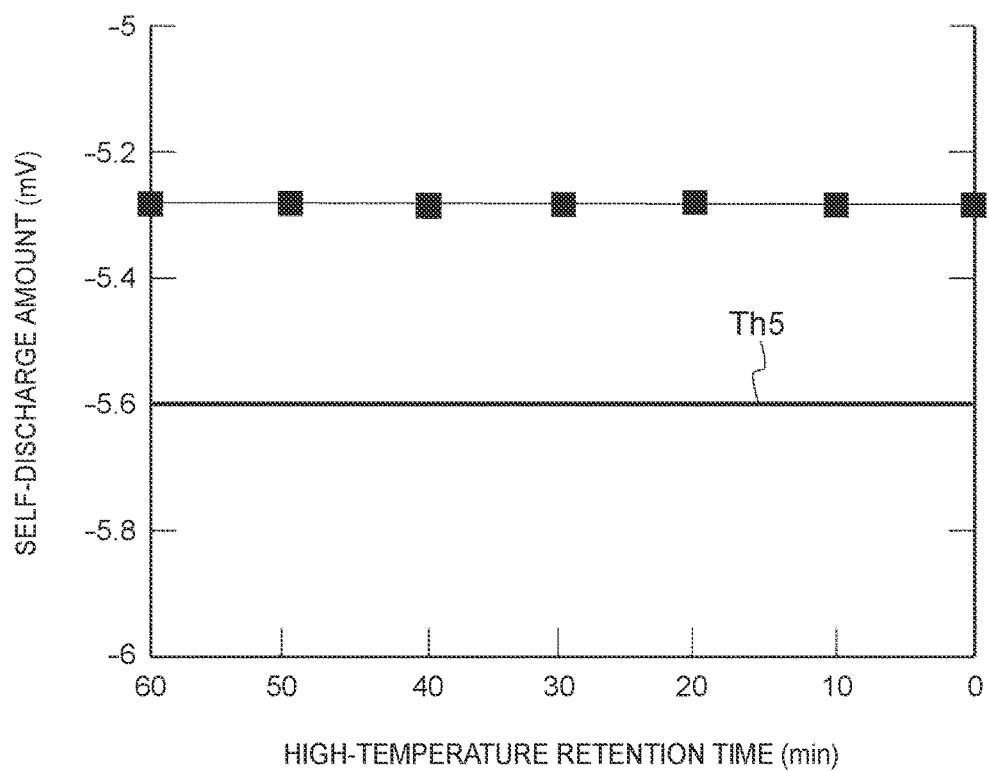
FIG. 15 is a graph of a relationship between a self-discharge amount after correction and a high-temperature retention time by the inspection method for the secondary battery according to the second embodiment.

A graph in FIG. 15 shows a correction result of the self-discharge amount that is the difference between the voltage Va and the voltage Vb for each of the high-temperature retention times and shows a relationship between the self-discharge amount after the correction and the high-temperature retention time. As shown in above FIG. 7, the self-discharge amount that is the differential voltage between the voltage Va and the voltage Vb is significantly decreased in accordance with the high-temperature retention time before the correction. On the other hand, in this embodiment, as shown in FIG. 15, the self-discharge amount after the correction is hardly changed even when the high-temperature retention time is changed. That is, the high-temperature retention time dependency (that is, the temperature dependency) of the self-discharge amount as shown in FIG. 7 is significantly suppressed in FIG. 15. For example, while the self-discharge amount in FIG. 7 is y=−0.00828x−5.28907, the self-discharge amount after the correction in FIG. 15 is y=1E−06x−5.2891. Accordingly, in the case where the threshold that is used to determine the voltage lowering failure is Th5 in FIG. 15, corrected ΔV is constantly larger than the threshold Th5. Thus, the voltage lowering failure can be inspected correctly.

As it has been described so far, in this embodiment, the differential voltage (the self-discharge amount) between the voltage Va after the first aging treatment and the voltage Vb after the second aging treatment is corrected, and the voltage lowering failure caused by the manufacturing failure is determined by using the self-discharge amount after the correction. In this way, the quality can be determined in the state where the fluctuation in the self-discharge amount caused by the temperature change is suppressed. Thus, the quality determination of the voltage lowering failure can accurately be made.

As it has been described so far, according to the method in an aspect of the invention, regarding the failure that does not depend on the difference between the temperature during the measurement of the first voltage and the temperature during the measurement of the second voltage, the quality is determined in accordance with the measurement value of the self-discharge amount. Regarding the failure that depends on the difference between the temperature during the measurement of the first voltage and the temperature during the measurement of the second voltage, the quality is determined in accordance with the self-discharge amount, the temperature dependency of which is suppressed. Thus, the quality determination that corresponds to an inspection item can be made, and the inspection accuracy can be improved.

In addition, in the first determination process, it may be determined as the failure if the variation in the voltage difference between the first voltage and the second voltage is larger than the first threshold. By measuring the post-first aging treatment termination voltage under the first temperature of the first aging treatment, the variation in the temperature of the secondary battery during the measurement of the first voltage is reduced, and the influence on the voltage measurement by the variation in the temperature can be suppressed. Thus, the accuracy of the quality determination can be improved.

In one example, in the second determination process, it may be determined as the failure if the voltage difference between the third voltage that is measured under the second temperature after the initiation of the second aging treatment and the second voltage is larger than the threshold. By measuring the voltage under the second temperature after the initiation of the second aging treatment, the temperature changes during the measurement of the post-second aging treatment initiation voltage and that of the post-second aging treatment termination voltage are reduced, and the influence on the voltage measurement by the temperature change can be suppressed. Thus, the accuracy of the quality determination can be improved.

In another example, in the second determination process, the temperature dependency of the voltage difference between the first voltage and the second voltage is corrected, and it may be determined as the failure if the voltage difference after the correction is larger than the threshold. By correcting the voltage difference between the post-first aging treatment termination voltage and the post-second aging treatment termination voltage, the influence on the voltage measurement by the temperature change can be suppressed. Thus, the accuracy of the quality determination can be improved.

It should be noted that the invention is not limited to the above embodiment but can appropriately be changed within a scope that does not depart from the gist thereof.

What is claimed is:

1. An inspection method for plural secondary batteries comprising:
    a first aging treatment process of performing aging treatment on a secondary battery of the plural secondary batteries that has initially been charged under a first temperature;
    a second aging treatment process of performing the aging treatment on the secondary battery under a second temperature, the second temperature being lower than the first temperature;
    measuring a first voltage, the first voltage being a voltage of the secondary battery that is measured under the first temperature after termination of the first aging treatment process;
    measuring a second voltage, the second voltage being a voltage of the secondary battery that is measured after termination of the second aging treatment process;
    computing a voltage difference between the first voltage and the second voltage, the voltage difference being computed as a self-discharge amount of the secondary battery in the second aging treatment process;
    a first determination process of determining first failure in accordance with the self-discharge amount, the first failure not depending on a relationship between the self-discharge amount and a difference between a temperature during measurement of the first voltage and a temperature during measurement of the second voltage; and
    a second determination process of determining second failure in accordance with the self-discharge amount, temperature dependency of which is suppressed, the second failure depending on the relationship between the self-discharge amount and the difference between the temperature during the measurement of the first voltage and the temperature during the measurement of the second voltage, wherein
    the aging treatment is performed on the plural secondary batteries in the first aging treatment process and the second aging treatment process,
    the first failure is determined in the first determination process when a variation in the voltage difference between the first voltage and the second voltage in the plural secondary batteries is larger than a first threshold, and
    the second failure is determined in the second determination process when the self-discharge amount, as corrected for temperature dependency, is larger than a second threshold.

2. The inspection method according to claim 1 wherein the first voltage is measured at a temperature of the first temperature ±5° C. in the measuring the first voltage.

3. The inspection method according to claim 1 wherein the second determination process includes:
    correcting temperature dependency of the voltage difference between the first voltage and the second voltage in each of the plural secondary batteries; and
    determining the second failure if the voltage difference after correction in any of the plural secondary batteries is larger than the second threshold.

4. The inspection method according to claim 1 wherein the first temperature is 40° C. to 80° C., and the second temperature is 0° C. to 30° C.

5. The inspection method according to claim 4 wherein the second temperature is lower than the first temperature by 20° C. or more.

6. An inspection method of plural secondary batteries comprising:
    a first aging treatment process of performing aging treatment on a secondary battery of the plural secondary batteries that has initially been charged under a first temperature;
    a second aging treatment process of performing the aging treatment on the secondary battery under a second temperature, the second temperature being lower than the first temperature;
    measuring a first voltage, the first voltage being a voltage of the secondary battery that is measured under the first temperature after termination of the first aging treatment process;
    measuring a second voltage, the second voltage being a voltage of the secondary battery that is measured after termination of the second aging treatment process;
    measuring a third voltage, the third voltage being a voltage of the secondary battery that is measured under the second temperature after initiation of the second aging treatment process;
    computing a voltage difference between the first voltage and the second voltage, the voltage difference being computed as a first self-discharge amount of the secondary battery in the second aging treatment process;
    computing a voltage difference between the third voltage and the second voltage, the voltage difference being computed as a second self-discharge amount of the secondary battery in the second aging treatment process;
    a first determination process of determining first failure in accordance with the first self-discharge amount, the first failure not depending on a relationship between the first self-discharge amount and a difference between a temperature during measurement of the first voltage and a temperature during measurement of the second voltage; and
    a second determination process of determining second failure in accordance with the second self-discharge amount, the second failure depending on the relationship between the first self-discharge amount and the difference between the temperature during the measurement of the first voltage and the temperature during the measurement of the second voltage, wherein the aging treatment is performed on the plural secondary batteries in the first aging treatment process and the second aging treatment process, the first failure is determined in the first determination process when a variation in the voltage difference between the first voltage and the second voltage in the plural secondary batteries is larger than a first threshold, and the second failure is determined in the second determination process when a voltage difference between the third voltage and the second voltage in any of the plural secondary batteries is larger than a second threshold.

7. The inspection method according to claim 6 wherein the third voltage is measured at a temperature of the second temperature ±5° C. in the measuring the third voltage, and the second voltage is measured at the temperature of the second temperature ±5° C. in the measuring the second voltage.

8. The inspection method according to claim 6 wherein the first temperature is 40° C. to 80° C., and the second temperature is 0° C. to 30° C.

9. The inspection method according to claim 8 wherein the second temperature is lower than the first temperature by 20° C. or more.

* * * * *